United States Patent [19]

Parker et al.

[11] 3,909,269

[45] Sept. 30, 1975

[54] LITHOGRAPHIC PLATE COMPRISING A LIGHT-SENSITIVE POLYMER

[75] Inventors: Edward H. Parker, Ballwin; Edward M. Harris, Webster Groves; Jim D. Meador, Bridgeton, all of Mo.

[73] Assignee: Western Litho Plate & Supply Co., St. Louis, Mo.

[22] Filed: Nov. 13, 1973

[21] Appl. No.: 415,356

Related U.S. Application Data

[62] Division of Ser. No. 272,796, July 18, 1972, Pat. No. 3,852,256.

[52] U.S. Cl. ...................... 96/86 P; 96/33; 96/35.1; 96/91 N; 96/115 R; 117/34

[51] Int. Cl.$^2$ ...................... G03C 1/70; G03C 1/52

[58] Field of Search ......... 96/115 R, 91 N, 35.1, 33, 96/86 P, 91 N; 117/34

[56] References Cited

UNITED STATES PATENTS

| | | | |
|---|---|---|---|
| 2,948,610 | 8/1960 | Merrill et al. | 96/33 |
| 3,770,443 | 11/1973 | Osada et al. | 96/115 R |
| 3,799,915 | 3/1974 | Dunnavant et al. | 260/86.1 R |
| 3,804,628 | 4/1974 | Osada et al. | 96/115 R |
| 3,817,757 | 6/1974 | Yabe et al. | 96/35.1 |

*Primary Examiner*—Ronald H. Smith
*Attorney, Agent, or Firm*—Koenig, Senniger, Power and Leavitt

[57] ABSTRACT

A light sensitive polymer, susceptible to crosslinking on exposure to actinic light. The polymer contains the recurring unit;

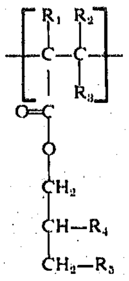

$R_1$, $R_2$ and $R_3$ are each selected from the group consisting of hydrogen, halogen and lower alkyl. At least one of $R_4$ and $R_5$ is an azidobenzoyloxy or azidonaphthoyloxy group. The other of $R_4$ and $R_5$ is selected from the group consisting of hydroxyl, halogen, alkoxy, aryloxy, aralkoxy, alkoxyalkoxy, aryloxyalkoxy, alkoxyaryloxy, aryloxyaryloxy, alkylacyloxy, arylacyloxy, alkenylacyloxy, aralkenylacyloxy, heterocyclic substituted alkenylacyloxy, azidobenzoyloxy and azidonaphthoyloxy.

8 Claims, No Drawings

LITHOGRAPHIC PLATE COMPRISING A LIGHT-SENSITIVE POLYMER

This is a division of application Ser. No. 272,796, filed July 18, 1972, now U.S. Pat. No. 3,852,256.

BACKGROUND OF THE INVENTION

This invention relates to the field of lithography and, more particularly, to novel photopolymers useful as light-sensitive coatings for lithographic plates, to novel monomers, and novel methods for preparing and using said monomers and polymers.

In the art of lithography, the instrument used for printing is an exposed and developed plate constituted by a hydrophilic oleophobic substrate covered in the image areas by an oleophilic hydrophobic coating. Typically, the substrate is a thin sheet of metal, such as aluminum, magnesium or zinc, and the coating corresponding to the image area to be produced consists of a water-insoluble material, for example, a diazo or azide compound. In printing the desired image on a surface, the plate is first contacted with a water solution which is repelled by the image areas, but retained by the nonprinting areas. Then the plate is contacted with an oil-base ink which spreads uniformly over the image area but is repelled by the nonimage areas of the substrate which have retained the water solution. The ink-laden plate is then pressed against the printing surface to produce the desired image on that surface.

To prepare a printing plate of the character described, a coating of a soluble light-sensitive material is applied uniformly over the surface of the substrate. Light is then projected through a transparent photograph (normally a negative) of the image onto the plate. In those areas where light passes through a negative and strikes the light-sensitive material, the latter is chemically converted into a hard water-insoluble oleophilic material. The areas of the coating unaffected by light retain the same chemical character that they originally possessed. A developer or solvent, such as water, an alkaline solution, gum arabic, or an organic solvent is then applied to the surface of the plate to dissolve and remove those portions of the coating which have not been subjected to light, leaving unaffected the image areas of the coating which have been converted by light into an insoluble material. The oleophilic layer remaining on the plate after treatment with the solvent thus assumes the configuration of the image to be printed. Positive working light-sensitive materials are also available. Such materials are initially insoluble in the developing solution but are converted to a soluble material where they are struck by light, and a developer is employed to dissolve the soluble material from the light-exposed areas. Exposure of plates coated with such materials is therefore effected by projection of light through a positive rather than a negative.

There are numerous light-sensitive resins or materials that can be used in preparing lithographic plates, and numerous processes by which such plates are produced. One process which provides a high quality plate is the so-called "Deep Etch" process wherein the plate is chemically etched in the exposed areas. However, the Deep Etch process is complex and expensive and the use of nonetched negative working plates largely predominates in this country. The light-sensitive materials which have found most common use in this country, until recently at least, are the so-called diazo resins, such as the condensation product of paraformaldehyde with the sulfate salt of paradiazodiphenyl amine (prepared as described in U.S. Pat. No. 2,714,066). Diazo type light-sensitive coatings for lithographic plates have proved satisfactory in many respect, but are rather fragile and must be reinforced by developing lacquers in order to withstand the wear and tear of printing. Diazo coatings also suffer from the disadvantage of being subject to fairly rapid deterioration on storage after application to the surface of a plate, particularly on storage of the plate at elevated temperatures. Such deterioration results in part from reaction of the diazo material with the underlying metal substrate. Aluminum substrates, which in most other respects represent the preferred substrate material, present a particular problem with respect to deterioration of diazo type light-sensitive materials.

To avoid the problems associated with the use of diazo resins, efforts have been devoted in the art to the provision of base plates having barrier coatings designed to prevent reaction between the resin and the metal substrate, while other efforts have been devoted to the development of various photopolymers which are relatively unreactive with the substrate. Typical of the barrier layers which have been developed are those disclosed in U.S. Pat. Nos. 2,714,066, 3,020,210, 3,064,562, 3,136,636, 3,136,639 and 3,148,984. A substantial amount of research in the art has been allocated to the development of photopolymers. Illustrative patents which describe certain previously known photopolymers include 2,610,120, 2,691,584, 2,725,372, 2,751,296, and 2,835,656. The basic objective of most photopolymer research activity has been the provision of linear polymers soluble in a variety of solvents and having pendant groups which crosslink on exposure to light to produce a hard insoluble polymeric matrix.

Prominent among the efforts in this direction has been the development of the various polymers derived from vinyl cinnamate. Ideally, vinyl cinnamate can be polymerized through the vinyl group to produce a linear photopolymer having pendant cinnamate groups. On exposure to light, the cinnamate groups should be photocrosslinkable to produce a hard insoluble substance which would serve as a printing surface for lithographic plates. Unfortunately, however, vinyl cinnamate suffers from certain serious drawbacks. Because of the relative proximity of the double bond of the vinyl group to the double bond of the cinnamate group, vinyl cinnamate suffers from an inordinate tendency to lactonize during attempts to polymerize it. Lactonization produces a product which is not light-sensitive. Even if lactonization is avoided, however, polyvinyl cinnamate polymers have not proved to be fully satisfactory in use. Exposed polyvinyl cinnamate plates are relatively fragile and cannot be rub developed. They must be spray developed, which often results in incomplete removal of the unexposed polymer and consequent scumming during a printing run.

Various other photopolymers have been developed prior to the present invention and certain of these have proved reasonably satisfactory. However, a continuing need has existed for improved photopolymers, particularly for photopolymers which may be photocrosslinked to provide printing surfaces with high abrasion resistance and for photopolymers which are highly light-sensitive and may be photo-crosslinked with or without the presence of sensitizers.

SUMMARY OF THE INVENTION

Among the several objects of the present invention therefore may be noted the provision of photopolymers which are photo-crosslinkable into durable lithographic printing surfaces; the provision of such photopolymers which can be readily prepared and applied to the surface of a lithographic plate; the provision of such photopolymers which are highly light-sensitive and may be photo-crosslinked with or without the presence of sensitizers; the provision of lithographic plates which upon photo-exposure provide printing surfaces which yield high-quality printed copies over long press runs; the provision of methods for preparing such photopolymers; the provision of monomers useful in producing such photopolymers; the provision of methods for applying such photopolymers to lithographic plates; and the provision of methods for exposing and developing plates carrying such polymers. Other objects and features will be in part apparent and in part pointed out hereinafter.

The present invention is therefore directed to a light-sensitive polymer susceptible to crosslinking on exposure to actinic light containing the recurring unit:

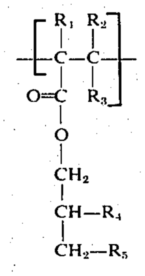

$R_1$, $R_2$ and $R_3$ are each selected from the group consisting of hydrogen, halogen and lower alkyl. At least one of $R_4$ and $R_5$ is an azidobenzoyloxy or azidonaphthoyloxy group. The other of $R_4$ and $R_5$ is selected from the group consisting of hydroxyl, halogen, alkoxy, aryloxy, aralkoxy, alkoxyalkoxy, aryloxyalkoxy, alkoxyaryloxy, aryloxyaryloxy, alkylacyloxy, arylacyloxy, alkenylacyloxy, aralkenylacyloxy, heterocyclic substituted alkenylacyloxy, azidobenzoyloxy and azidonaphthoyloxy.

The invention is further directed to a process for producing light-sensitive polymers of the aforementioned character. The process comprises esterifying a polymer intermediate containing the recurring unit:

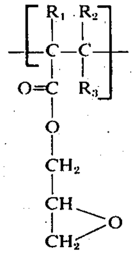

where $R_1$, $R_2$ and $R_3$ are as defined above with a compound selected from the group consisting of azidobenzoic acid, azidobenzoyl halides, azidonaphthoic acid and azidonaphthoyl halides in the presence of a catalyst for the esterification.

Also included in the invention are certain novel monomers, lithographic plates bearing the polymers of the invention, methods for preparing such plates, and methods for exposing and developing such plates.

DESCRIPTION OF THE PREFERRED EMBODIMENTS

In accordance with the invention, novel photopolymers are provided which are readily prepared and applied to lithographic plates. When such plates are exposed to actinic light, the photopolymer photo-crosslinks through its pendant azidobenzoyloxy or azidonaphthoyloxy groups to produce a hard insoluble material in those areas which are struck by light. When light impinges on a surface constituted by the photopolymers of the invention, the azido group decomposes giving off molecular nitrogen and leaving a highly active nitrene.

$$Ar - N_3 \rightarrow Ar - N: + N_2\uparrow$$

The nitrene is highly active and crosslinking of the photopolymers takes place through this intermediate. While we do not wish to be bound to any particular theory, it is believed that the nitrene crosslinks not only with the nitrenes depending from neighboring polymer chains, but may also attack and attach itself to carbon atoms in both the backbone and pendant structures of the neighboring chains. As a consequence, a high density of intimate crosslinking bridges is formed, imparting high-strength, hardness and abrasion resistance to the crosslinked polymer. After development using a solvent which removes noncrosslinked polymer from unexposed portions of the plate, a rugged and durable printing surface is provided which yields high-quality printed copies even after extended press runs. Although primarily intended for use in preparing lithographic plates, the photopolymers of the invention may also find application as photo-resist materials in such processes as chemical milling or the production of printed circuits.

Certain preferred polymers of the invention, for example, the monoazidobenzoate ester of polyglycidyl methacrylate are readily developed using relatively mild developing solvents including developing solvents containing high proportions of water. We are not certain as to the precise reason for this characteristic, but it is believed that susceptibility of the preferred photopolymers to development with relatively mild developing solutions may be attributable to the presence of a free hydroxyl group on the pendant chain$\beta$- to the azidobenzoate ester moiety. As more fully discussed below, this hydroxyl group may be provided by esterification of glycidyl methacrylate units of an intermediate polymer with an acid such as p-azidobenzoic acid.

The novel photopolymers of the invention also include various species wherein the free hydroxyl group is esterified with a second azidobenzoate or azidonaphthoate group providing a photopolymer which on exposure to actinic light is converted to a photo-hardened polymer having an exceptionally high density of crosslinking bridges. Photopolymers of this nature are not as readily developed with polar solvents as are those containing a free hydroxyl group but are believed to be more light-sensitive and to be adherent to a somewhat wider variety of substrates. Alternatively, of course, the free hydroxyl group may be blocked with a nonlight-sensitive group which may be advantageous, for example, where certain developing solvents are used which have a high affinity for the blocking group. Further advantages may be realized in ink receptivity if the free hydroxyl group is blocked with a long chain moiety such as a dodecyl or dodecoyl group.

As indicated, therefore, the polymers of the invention each contain a recurring unit having one generic structure:

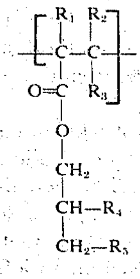

where $R_1$, $R_2$, $R_3$, $R_4$ and $R_5$ are as defined above. These photopolymers may include, for example, homopolymers, copolymers containing the above recurring unit and one or more recurring units derived from nonlight-sensitive monomers, and copolymers containing two or more distinct light-sensitive recurring units, with or without additional units derived from nonlight-sensitive monomers.

Typical groups which may constitute $R_1$, $R_2$, and $R_3$ in the above structure include hydrogen, methyl, ethyl, n-propyl, chlorine and bromine. It is normally preferred that $R_1$ be methyl. Where $R_1$ is hydrogen it is necessarily a tertiary hydrogen through which premature crosslinking can take place if conditions are not properly controlled during the preparation of the photopolymer. For the same reason, it is generally preferred that $R_2$ be hydrogen only if $R_3$ is also, and vice-versa.

Where the polymers of the invention contain a single light-sensitive group, $R_4$ is normally hydroxyl and $R_5$ is normally an azidobenzoate or azidonaphthoate group, although it is possible for the identities of $R_4$ and $R_5$ to be just the reverse.

One of $R_4$ and $R_5$ may be another type of light-sensitive group such as an aralkenylacyloxy or heterocyclic substituted acyloxy group. Thus, for example, one of $R_4$ and $R_5$ may be cinnamoyloxy, p-nitrocinnamoyloxy, naphthylacryloyloxy, p-methoxycinnamoyloxy, furylacryloyloxy, thienylacryloyloxy, indoylacryloyloxy, 5-phenylpentadieneoyloxy, or indenylacryloyloxy. Other potentially crosslinking groups such as alkenylacyloxy may also constitute one of $R_4$ and $R_5$. Typical alkenylacyloxy groups include methacryloyloxy, acryloyloxy, crotonyloxy, itaconoyloxy, and stearoyloxy.

Where $R_4$ or $R_5$ includes a blocking group, it may typically be methoxy, ethoxy, n-propoxy, isopropoxy, chloromethoxy, n-butoxy, isobutoxy, n-pentoxy, phenyl methoxy, p-tolyl ethoxy, nitroheptoxy, dodecyloxy, phenoxy, nitrophenoxy, naphthoxy, chloronaphthoxy, p-methyl phenoxy, acetoxy, propanoyloxy, butanoyloxy, octanoyloxy, bromoacetoxy, phenyl propanoyloxy, benzoyloxy, p-methylnaphthoyloxy, chlorobenzoyloxy, toluoyloxy, xyloyloxy, methoxyethoxy, ethoxyethoxy, ethoxypropoxy, butoxypropoxy, chloromethoxyethoxy, methoxyphenoxy, ethoxynaphthoxy, butoxyphenoxy, phenoxyethoxy, naphthoxypropoxy, p-methylphenoxybutanoxy, phenoxyphenoxy, phenoxynaphthoxy, naphthoxynaphthoxy, naphthoxyphenoxy, etc. When an acid halide is employed to esterify an epoxide in the preparation of the polymers of the invention (as discussed more fully below), $R_4$ or $R_5$ is believed to be a halogen atom derived from the acid halide.

The polymers of the invention are conveniently obtained by using as a starting material an ester of an epoxy alcohol and an $\alpha$-$\beta$ unsaturated acid, the ester having the structure:

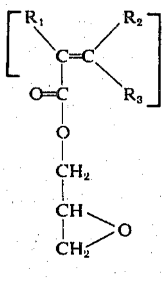

wherein $R_1$, $R_2$, and $R_3$ are as defined above. Most readily available of such monomeric esters are glycidyl acrylate and glycidyl methacrylate, with the latter being a preferred starting material.

In the preparation of the polymers of the invention, the preferred method is to first polymerize the epoxy ester monomer set forth above and subsequently esterify the polymer with an azidobenzoic acid, an azidonaphthoic acid, or one of the corresponding acid halides. In accordance with this method, a mixture is prepared containing a monomer having the above-noted structure (for example, glycidyl methacrylate) and a polymerization initiator under inert atmosphere. The mixture may also contain another monomer corresponding to the above-noted structure and/or various other ethylenically unsaturated monomers. Polymerization is effected to produce a polymer intermediate containing the recurring unit:

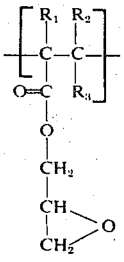

wherein $R_1$, $R_2$, and $R_3$ are as defined above. The polymer intermediate is then reacted with an acid or acid halide as stated above.

Preparation of the polymer intermediate may be effected by solution, emulsion, suspension or bulk polymerization. Where the photopolymer ultimately produced is destined for lithographic use, however, solution polymerization is preferred.

Solution polymerization is accomplished by preparing a mixture containing the monomer(s), a polymerization initiator and an organic solvent, and holding this mixture at elevated temperatures for a time sufficient for the polymer to form. The polymerization reaction is conducted under an inert atmosphere to exclude oxygen, since oxygen is a free radical scavenger which inhibits the progress of polymerization. An inert atmosphere may be provided by means of a blanket of inert gas under positive pressure or by polymerizing at a temperature at which the vapor pressure of the polymerization mixture equals the total pressure of the system, e.g., under reflux conditions.

A wide range of temperatures may be employed for solution polymerization, but a temperature of between about 60°–80°C. has been found to be optimum. At temperatures in this range, polymerization proceeds to a conversion of 50–90% in 3–24 hours. Termination of the reaction after periods of anywhere from 1–48 hours normally results in the production of a satisfactory polymer intermediate. Generally, however, optimum results are obtained at a temperature of approximately 70°–80°C. for a period of 1–12 hours.

The concentration of monomer at the start of polymerization is not critical. Preferably, however, an initial monomer concentration of about 10–18% by weight is utilized. Concentrations about 20% by weight may show gelling tendencies.

Essentially any of the numerous polymerization initiators may be utilized in the polymerization reaction. Particularly useful initiators include azides such as azobisisobutyronitrile, azodicyclohexylcarbonitrile and dimethyl $\alpha$, $\alpha'$-azodiisobutyrate and the organic peroxides such as benzoyl peroxide, lauroyl peroxide, cumene hydroperoxide, dicumyl peroxide, dichlorobenzoyl peroxide and t-butyl hydroperoxide. Concentrations up to 5% by weight of the initiator can be employed.

A variety of solvents may be used for the polymerization reaction. Among the useful solvents may be mentioned methyl ethyl ketone, diethyl ketone, tetrahydrofuran methylene dichloride, ethylene dichloride, 1,1-dichloroethane and perchloroethylene. Methyl ethyl ketone and tetrahydrofuran are particularly convenient and effective solvents for the polymerization reaction. Aromatic solvents, alcohols and amines are preferably not used.

The finished photopolymer is recovered from the polymerization reaction mixture by any convenient method, e.g., by simple precipitation. A preferred method of recovery is to mix the polymerization reaction solution with a large excess of a low molecular weight alcohol, thus precipitating out the polymer which is then recovered by filtration.

Emulsion polymerization can generally be conducted at much faster rates than solution polymerization, though control of product quality may, in some cases, be more difficult. In this polymerization method, an emulsion of monomer in water is prepared and a water-soluble initiator is added to the emulsion. The initiator is activated either by heating the system to its reflux temperature of about 80°–95°C. (the "reflux" method) or by incorporating a reducing agent in the system (the "redox" method). Either of these techniques generates free radicals from the initiator which in turn attack the monomer and start the chain reaction of polymerization.

In either the reflux or redox method, the emulsion typically contains between 20 and 40% by weight of monomer based on the weight of the emulsion and between about 0.1 and 2% of water soluble initiator based on the weight of the monomer. Approximately 1–6% by weight of an emulsifying agent, based on the monomer, is required to produce the degree of dispersion required to form an emulsion. As indicated above, the temperature of reaction in the reflux process is typically 80°–95°C. The redox process does not require elevated temperatures and is conveniently conducted at temperatures between room temperature and 60°C. An inert atmosphere is maintained above the reaction mixture during polymerization. In the reflux method, the vapor pressure of the system equals the total pressure and oxygen is excluded without an independent inert gas supply. In the redox method, an independent inert gas supply is necessary. Reaction time, for both methods, is 1–2 hours.

Among the water-soluble initiators which are employed in emulsion polymerization may be noted ammonium persulfate, sodium persulfate, potassium persulfate, tertiarybutyl hydroperoxide and hydrogen peroxide. The emulsifying agent may be essentially any ionic or nonionic surfactant which is compatible with the monomers employed. Most monomers are compatible with most surfactants but there are some combinations which do not yield satisfactory emulsions. The compatibility or incompatibility of various monomer-surfactant combinations may be determined by simple testing.

In the redox method, the reducing agent which acts directly on the initiator is conveniently a metal ion, such as ferrous or cerous ion, which has a higher oxidation state to which it is converted on reaction with the initiator. In a preferred embodiment of the invention, only a catalytic amount of the metal ion is present and a relatively large amount, for example 0.1 to 2% by weight based on the monomer, of another reducing agent is employed for purposes of reducing oxidized ions such as ferric ions back to ferrous for further reaction with the initiator. Among the secondary reducing agents which may be so employed are sodium formaldehyde sulfoxylate, sodium sulfite, sodium metabisulfite, sodium hydrosulfite and sodium thiosulfate.

After completion of the polymerization reaction, the polmyer is conveniently recovered from the emulsion by addition of an excess of a lower alcohol and the resulting precipitate separated from the mixture by filtration. Alternatively, the polymer may be recovered by precipitation through acidification of the emulsion or by destroying the emulsion through addition of a salt such as sodium chloride. Other methods of recovering the polymer from the emulsion will be apparent to those skilled in the art.

The techniques employed in suspension polymerization are in certain ways similar to those employed in emulsion polymerization, but the nature of the process is quite different. Thus, suspension polymerization, like emulsion polymerization, utilizes an aqueous carrier for the monomer and includes similar types of surfactants in the reaction system. However, the surfactant is employed in smaller proportions and thus acts not as an emulsifier but as a dispersing agent which aids the breakdown of the bulk of monomer into small globules distributed throughout the aqueous medium. A solvent-soluble initiator is used so that each monomer globule is essentially a bulk polymerization site. As the polymerization reaction progresses, solid polymer particles are precipitated and, if the system is not strongly agitated, may settle out at the bottom of the polymerization vessel.

To prevent agglomeration of globules of partially polymerized material, a suspending agent, thickner or salt is usually incorporated in the polymerization medium. Colloidal suspending agents such as cellulose derivatives, gums, polyacrylate salts, gelatin, starch, alginates and polyvinyl alcohol are absorbed on the surface of the globules and prevent their sticking together. Thickeners, such as glycols, glycerol, and polyglycols increases the viscosity of the system, and thus its degree of dispersion. Salts increase interfacial tension, lower the solubility of the monomer in the aqueous phase and increase its density.

A small amount of a lubricant such as lauryl alcohol, cetyl alcohol or stearic acid is also preferably included in the polymerization medium. Lubricants promote the formation of uniform globules or polymerizing material.

The proportions of monomer and initiator are approximately the same for a suspension polymerization system as they are for an emulsion system. Polymerization is conveniently conducted at temperatures on the order of about 70° to about 90°C. under an inert atmosphere. Product recovery is effected by filtration of the solid polymer product from the water carrier.

As noted above, various ethylenically unsaturated comonomers may be utilized in the above described polymerization process. Comonomers which may be employed include light-sensitive comonomers such as ethylene glycol methacrylate cinnamate and the other photosensitive monomers described in the copending coassigned application of Dunnavant et al., Ser. No. 173,661, filed Aug. 20, 1971. Nonlight-sensitive monomers which may be used include acrylic acid, methacrylic acid, maleic anhydride, styrene, dimethylaminoethyl methacrylate, tertiary butylaminoethyl methacrylate, vinyl toluene, α-methyl styrene, dimethyl styrene, diethyl styrene, cyanostyrene, monochlorostyrene, dibromostyrene, difluorostyrene, trichlorostyrene, tetrabromostyrene, isopropenyl toluene, vinyl acetate, vinyl chloride, vinyl stearate, methyl methacrylate, butyl methacrylate, isopropyl methacrylate, methyl ethacrylate, ethyl methacrylate, ethyl ethacrylate, methyl acrylate, ethyl acrylate, isopropyl acrylate, butyl acrylate, vinylidene fluoride, methyl vinyl ether, ethyl vinyl ether, butyl vinyl ether, methyl p-vinyl benzoate, ethyl p-vinyl benzoate, dimethyl fumarate, methyl ethyl fumarate, diethyl maleate, dimethyl itaconate, diethyl citraconate and paradimethyl amino styrene. If desired, a major proportion of the copolymer may be constituted by recurring units derived from those ethylenically unsaturated comonomers. Desirably the esterfied polymer contains at least 10% by weight of light-sensitive recurring units.

The polymer intermediate is esterfied with an azidobenzoic acid, an azidobenzoyl halide, an azidonaphthoic acid or an azidonaphthoyl halide. The use of an acid is preferred for initial esterification of the pendant epoxy groups of the polymer intermediate.

Esterification of the polymer intermediate is preferably carried out in the presence of an organic solvent. A wide range of organic solvents can be used. A preferred solvent for the esterification is methyl ethyl ketone. Other useful solvents include diethyl ketone, methyl isopropyl ketone, tetrahydrofuran, methylene dichloride, ethylene dichloride, and perchloroethylene.

The esterification reaction is catalyzed preferably by a quaternary ammonium salt such as, for example, benzyltriethylammonium chloride or benzyltrimethylammonium methoxide. Other catalysts which may be used for the esterification include lithium acetate and triethyl amine. Preferably, the esterifying acid is present in slight stoichiometric excess over the pendant epoxy units of the polymer intermediate and the total concentration of reactants is on the order of 10–15% by weight. The temperature may generally range from room temperature to the reflux temperature of the system and the required reaction time varies between about 3 hours and 6 days depending upon the temperature used. The resultant polymer may be recovered from the reaction solution by any conventional method, for example, by simple precipitation. In a preferred embodiment of the invention the photopolymer product is precipitated in excess methanol, recovered by filtration and washed with additional portions of methanol.

Esterification of the pendant epoxide groups of the polymer intermediate with an acid produces a light-sensitive polymer with a free hydroxyl group on the pendant structure β- to the azidobenzoyloxy or azidonaphthoyloxy moiety. The polymer may be used in this form and, as noted above, the presence of the free hydroxyl groups renders the polymer susceptible of development with mild developing solvents. Alternatively, the free hydroxyl group may be esterfied by further reaction with an acid or an acid halide. The second esterification can be effected by supplying an excess of the azidobenzoic or azidonaphthoic acid to the esterification zone in the esterification of the polymer intermediate. As the free hydroxy group is esterified by an acid, by-product reaction water is produced and should be removed from the reaction zone, typically by refluxing of the reaction mixture and separating moisture from condensed solvent before return of the solvent to the reaction zone.

Unlike esterification of the epoxide ring, however, esterification of the free hydroxyl group is more conveniently accomplished using an acid halide rather than an acid. In certain cases, therefore, it may be preferable to recover the monoesterified polymer from the initial esterification reaction medium and conduct further esterification with an acid halide in a separate operation.

When the second esterification is carried out with an acid halide, a hydrogen halide, for example, hydrogen chloride is produced as a by-product and must be removed from the reaction zone. Although it may be possible to effect removal of the hydrogen halide by simply driving it off, it is preferable to include a hydrogen halide scavenger or acceptor in the esterification mixture. A variety of hydrogen halide acceptors may be employed in the esterification. In general, almost any base can be employed for this purpose. When inorganic bases such as potassium hydroxide or sodium hydroxide are employed, the reaction follows the classical Schotten-Baumann mechanism, but unlike most Schotten-Baumann syntheses, the esterification reaction of this invention proceeds more satisfactorily in the absence Among water. Amonf the organic bases which may serve as hydrogen halide acceptors, the tertiary amines are preferred since they react rapidly with hydrogen halides to produce insoluble adducts which precipitate from the reaction media. The tertiary amines, moreover, can be readily reclaimed from their hydrogen halide adducts by reaction with an alkali metal hydroxide and then recycled to the esterification zone.

Pyridine has been found to be a particularly useful hydrogen halide acceptor for the reactions of this invention. It is preferable to have a slight molar excess, for example, 2–3% excess of the halide acceptor present in the reaction solution.

Where esterification is effected with an acid halide and a hydrogen halide acceptor which yields an insoluble by-product is used, the first step in recovery of the product photopolymer from the esterification solution is separation of the hydrogen halide adduct from the solution by conventional solid/liquid separation means, as by filtration. To insure maximum product recovery, the resulting filter cake is preferably washed with solvent and the washings added to the filtrate containing the product polymer.

Following the separation of the adduct and prior to recovery of the product photopolymer, it is also generally desirable to wash the esterification mixture with dilute alkaline solution to insure elimination of residual amounts of acidic reaction by-products. The dilute alkaline wash is followed with a dilute acid wash to neutralize residual alkalinity resulting from the alkaline wash, or from alkaline reaction by-product. The acid wash is followed with a water wash to remove acid and salts. The resulting solution is dehydrated and may be decolorized with activated carbon prior to separation of the polymer therefrom.

As indicated above, the free hydroxyl group (produced on monoesterification of the expoxide ring with an acid) may also be blocked with a nonlight-sensitive group. Substitution of such blocking group may be accomplished by conventional etherification or esterification methods.

In the preparation of the photopolymers of the invention, it is also possible to follow the alternative procedure of initially esterifying the starting monomer:

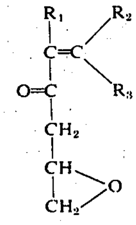

with a substituted or unsubstituted azidobenzoic acid or acid halide to yield a novel intermediate monomer having the structure:

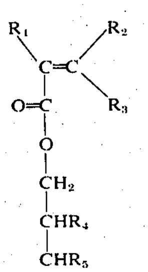

where $R_1$, $R_2$, $R_3$, $R_4$ and $R_5$ are as defined above, and then polymerizing the intermediate monomer. Because of synthesis difficulties, apparently related to premature polymerization and crosslinking, this method is not preferred. If conditions are carefully controlled, however, as illustrated in Example 20, infra, this method may be used successfully.

In esterification of the epoxy ester monomer, as in the esterification of the polymer intermediate, the free hydroxyl group obtained on rupture of the epoxide ring with an acid may optionally be esterified with another mole of acid or acid halide or, alternatively, may be either esterified or etherified with a nonlight-sensitive blocking group. In any case, the intermediate monomer obtained is homopolymerized or copolymerized to produce a photopolymer of the invention.

Polymerization of the intermediate monomer is carried out in essentially the same fashion as polymerization of the epoxy ester monomer as described above. Where solution polymerization is employed, the same limitations on the choice of solvent generally apply.

Where a monoesterified monomer is polymerized to produce a polymer having free hydroxyl groups on the pendant moieties $\beta$- to the light-sensitive groups, it is, of course, possible to subsequently subject the polymer obtained to further esterification in accordance with the method described above.

The lithographic plates of the invention are prepared by applying a dilute solution or emulsion of photopolymer in a volatile solvent to the surface of a base plate. A wide variety of solvents may be used. Thus, aromatic hydrocarbons, halogenated solvents, esters, ethers and ketones are generally effective. A particularly effective vehicle for the photopolymers is a 50-50 weight-to-weight mixture of ethylene glycol monoethyl ether acetate and methyl ethyl ketone.

The concentration of photopolymer in the application vehicle may vary widely depending upon the method of coating. If whirl coating is employed, the polymer concentration should not normally exceed about 5% by weight, or an excessively thick layer of polymer may be formed which requires an extended exposure time for satisfactory development. Higher concentrations of polymer can be used, however, if rod or roller coating is employed. For roller coating, the polymer concentration may be on the order of 70% or higher by weight. Other methods which may be employed include simply wiping the polymer solution on the plate with a brush or cloth, spray coating, and curtain coating. The appropriate polymer concentrations best adapted to each of these methods can be readily determined by simple experimentation.

Although the photopolymers of this invention readily crosslink on exposure to ultraviolet light of an appropriate short wavelength, a sensitizer is preferably included in the light-sensitive coating so that it crosslinks at the longer wavelengths emitted by carbon arc, mercury vapor or pulsed xenon ultraviolet light sources. 4-4′ bis (diethylamino) benzophenone (DEAB), in a concentration of about 5 parts per 95 parts photopolymer, is the preferred sensitizer. Other useful sensitizers include 4-4′ bis (dimethylamino) benzophenone, benzil, anthraquinone, nitro compounds, thiazole and thiazole derivatives.

The linear photopolymers of the invention may be applied to any of the various base plates which are conventionally used in the lithographic art to produce the lithographic plates of the invention. Among the various base plates which may be employed are those wherein the substrate for the photopolymer is constituted by aluminum, zinc, magnesium, plastic or paper. Where an aluminum base plate (currently the most prevalent type of base plate in the art) is used as a substrate for the photopolymer, the plate is preferably subjected to certain pretreatment operations before receiving the photopolymer coating in order to insure the production of a rugged plate which will provide sharp and clear printed images.

The initial step of pretreatment simply involves cleaning and degreasing of the plate. Cleaning and degreasing may be accomplished by use of any suitable solvent, for example, isopropanol. A preferred method of degreasing the substrate is to immerse it in a solution containing 1% trisodium phosphate and 1% sodium metasilicate at a temperature of about 150°F. for a period of about 1 minute.

After degreasing and cleaning, the substrate is grained. Graining may be accomplished by various methods which involve either mechanical, chemical or electrochemical action. Mechanical graining is effected by use of any suitable abrading technique such as, for example, sandblasting, ball graining or brush graining. The substrate may be chemically grained by immersion in a mixture of phosphoric and hydrofluoric acids, such as for example, a solution containing about 30 parts water, about 7 parts 85% phosphoric acid and about 0.03 parts hydrofluoric acid. Various caustic solutions may also be employed, as may dilute hydrofluoric acid if the operation is carefully controlled. A convenient method of electrochemical graining is described by Wruck in U.S. Pat. No. 3,072,546. In accordance with this method, two plates to be grained are immersed in a weak hydrochloric acid solution having a strength of about ½ Be to about 1 Be, the two plates being disposed in parallel facing relation between about ¾ inch and about 1⅛ inches apart. An alternating current is then passed between the two opposed surfaces at a voltage between about 5 and about 11 volts, at a temperature between about 15° and 26°C. for a period of 25 to 35 minutes. Other useful electrochemical graining methods are described in Hering U.S. Pat. No. 2,687,373 and Adams U.S. Pat. No. 3,073,765.

Following graining, the aluminum substrate is preferably anodized. Anodization of the substrate helps give the photopolymer "feet", i.e., it promotes adherence of the photocrosslinked polymer to the plate following exposure. In a preferred embodiment of the invention, the substrate is anodized in a sulfuric acid solution containing 10–50% by weight $H_2SO_4$ at approximately room temperature using alternating current at a density of 15–25 amperes per square foot. Anodization can also be accomplished in a phosphoric acid solution having a strength between about 25 and 35% by weight, preferably using direct current, at a current density of between about 4 and 22.7 amperes per square foot and a temperature of between about 70° and about 120°F. A time of between about ¾ of a minute and 6 minutes is usually required, for example, to properly anodize the surface of a grained aluminum substrate. Other reasonably well dissociated organic or inorganic acids such as, for example, hydrochloric, chromic, oxalic and citric acid may be used in anodizing the substrate, under conditions similar to those stated above for phosphoric and sulfuric acids. The anodized substrate is then washed thoroughly with water to remove the acid electrolyte and the excess water is removed from the washed, anodized sheet, preferably by suitable mechanical means such as, for example, squeegeeing.

To promote releasability of unexposed photopolymer from the surface of the base plate following exposure and to insure the hydrophilicity of the surface, the base plate preferably includes a "barrier" layer overlying the aluminum substrate. This barrier layer, which may conveniently be constituted by an alakali metal silicate, a pholacrylic acid or any of the other materials described in the patents referred to above, is thus interposed between the surface of the substrate and the photopolymer coating. The extent of direct contact between the photopolymer and the aluminum substrate is thereby minimized. This obviates difficulties which can occasionally arise as a result of a tendency of the photopolymer to strongly adhere to the aluminum substrate and resist removal on development. While it thus promotes removal of unexposed polymer during development, the use of a barrier layer does not have a significant adverse effect on adhesion of the photohardened polymer, particularly if the substrate is anodized.

A silicate barrier layer may be applied to an aluminum substrate by any of the various conventional methods known to the art. Among such methods are those described in U.S. Pat. No. 2,714,066 and U.S. Pat. No. 3,181,461.

To apply a polyacrylic acid barrier layer, the aluminum substrate is contacted at room temperature with an aqueous solution of colloidal polyacrylic acid having a molecular weight of between about 30,000 and about 300,000. Such solutions are commercially avialable, including, for example, the various polyacrylic acid solutions sold under the trade name "Acrysol" by Rohm & Haas Company. Thus, "Acrysol A-3" contains 25% by weight polyacrylic acid having a molecular weight of less than 150,000, and "Acrysol A-5" contains 25% by weight polyacrylic acid having a molecular weight of less than 300,000. It will be understood that other commercially available polyacrylic acid solutions may also be used. The strength of the polyacrylic acid solution as applied should not be higher than about 5% by weight and, if the above-noted Acrysols are used, they should be diluted to this strength or lower. Contact of the surface with the substrate can be any convenient means, such as by brief immersion, spraying, et cetera.

After the surface of the substrate is fully coated with polyacrylic acid solution, excess solution is removed, as by squeegeeing. The plate is then dried, which may be accomplished by simply allowing moisture to evaporate therefrom. Alternatively, heat, forced air or vacuum may be employed to accelerate drying.

The preferred base plate of the invention is constituted by an electrochemically grained and anodized aluminum sheet, to which a barrier layer may optionally be applied.

The lithographic plates of this invention are prepared for printing by exposing them to a source of actinic light through a photographic negative and developing the exposed plate with a solvent for the unexposed photopolymer. The degree of exposure required to fully photo-harden the polymer in the exposed area is on the order of 20 lux units or higher. Since the photopolymers of this invention form insoluble films when photocrosslinked, they may be developed simply by use of an organic solvent or a mixture of an organic solvent and water.

Where the photopolymer contains free hydroxyl groups in its pendant structures, the developing solvent may contain substantial proportions of water. For example, developing solvents containing 9 parts water to 1 part cyclohexanone or 7 parts water to 3 parts $\gamma$-butyrolactone are effective for the production of sharp images from the photopolymers of the invention.

The use of emulsion developers which are required for conventional diazo resins in order to provide a lacquer film on the exterior surface of the exposed resin is not necessary for the development of the photopolymers of this invention, but such developers may be employed. A developing solvent which has been found especially suitable for the lithographic plates of this invention is ethylene glycol monoethyl ether acetate, which may be employed by itself or in emulsion form. The following examples illustrate the invention:

Example 1 p-Aminobenzoic acid (50.0 g.) and a solution prepared from 39 ml. of concentrated hydrochloric acid and 115 ml. of waer were charged to a round bottom flask. The flask was placed in a temperature bath maintained at 101°–102°C., and the mixture contained in the flask was stirred for 2 hours as reaction proceeded. The reaction mixture was cooled, transferred to a beaker, the round bottom flask was washed with 30 ml. of water, and the washing was added to the beaker. The beaker was placed in an ice bath and a mixture containing concentrated hydrochloric acid (50 ml.) and cracked ice (192 g.) was added. The resulting mixture was stirred until a temperature of 2°C. was achieved, A solution containing sodium nitrate (25.9 g.) in cold water (80 ml.) was added to the beaker over a period of 16 minutes. Additional cracked ice was added as needed to maintain the temperature at less than or equal to 10°C. The reaction mixture was stirred for an additional 28 minutes, after which the temperature was 2°C. A solution containing sodium azide (23.7 g.) in water (125 ml.) was then added over a 15-minute period, during which sodium azide addition the temperature was controlled at less than or equal to 13°C. After the azide addition, the mixture was stirred for an additional 20 minutes (with a final temperature of 8°C.) and the product p-azidobenzoic acid was collected by filtration. The filter cake was washed thoroughly with water and then removed from the filter and dried at 50°C. in an oven. The crude cream-white powder (55.2g.) exhibited a melting point of 178°–181°C.

Example 2

A 3-liter beaker was placed in a larger vessel and the beaker was equipped with a stirrer and a thermometer. A solution containing concentrated hydrochloric acid (60 ml.) in water (115 ml.) was charged to the beaker together with m-aminobenzoic acid (41.1 g.). The resulting mixture was stirred and cooled in an ice bath to less than or equal to 5°C.

A cold solution containing sodium nitrite (20.7 g.) in water (84 ml.) was added in small portions to the stirred mixture over a 12-minute period. Cracked ice was added as needed during the nitrite addition to maintain the temperature at less than or equal to 9°C. The resulting solution was stirred for an additional 23 minutes and then, with the temperature at 0°C., a cold solution containing sodium azide (19.5 g.) in water (75 ml.) was added over a further 13-minute period. Cracked ice was occasionally added during azide addition to maintain the temperature at less than or equal to 10°C. After addition of the sodium azide solution was complete, the cold reaction mixture was stirred for 10 more minutes, and the solid product was collected by filtration. The crude m-azidobenzoic acid filter cake was washed with water, removed from the filter, dried for several days at room temperature in the dark, and then at 46°C. in an oven. A tancolored product (46.6 g) was obtained which exhibited a melting point of 156°–158.5°C.

EXAMPLE 3 o-Azidobenzoic acid was prepared in the manner described in Example 2, except that o-aminobenzoic acid was used in place of m-aminobenzoic acid as the starting material. An 82% yield of a tan-colored powder was obtained. The product had a melting point of 142°–143°C.

EXAMPLE 4

3-Azido-2-naphthoic acid was prepared in accordance with the method described in Example 2, except that 3-amino-2-naphthoic acid was used in place of m-aminobenzoic acid as the starting material. The crude reaction product was dried at 50°C. to give an 85% yield of a rust-colored powder having a melting point of 168°–170°C. (dec.).

EXAMPLE 5

A mixture containing p-azidobenzoic acid (18.0 g.), thionyl chloride (36 ml.) and benzene (200 ml.) was heated at reflux temperature for 1.5 hours. Solvent was removed on a rotary evaporator at reduced pressure, and ligroine was added to the residual oil. On cooling, solid p-azidobenzoyl chloride precipitated from the solution and was separated by filtration. This solid was recrystallized from ligroine, yielding 13.1 g. of a pinkish-brown solid having a melting point of 55.5°–57°C.

EXAMPLE 6

A round bottom flask was charged with glycidyl methacrylate (77.4 g.), methyl ethyl ketone (515 ml.) and azobisisobutyronitrile (0.39 g.). The solution thus prepared was flushed well with nitrogen and heated at reflux for 24 hours to effect polymerization. The polymer was precipitated in methanol and the resulting heterogeneous mixture was allowed to stand over a week end. A trace of concentrated hydrochloric acid was then added to the mixture and the precipitated polymer recovered by filtration and dried. 59 g. of product were obtained.

EXAMPLE 7

A mixture containing glycidyl methacrylate (77.4 g.), methyl ethyl ketone (540 ml.) and azobisisobutyronitrile (AIBN) (1.56 g.) was stirred at reflux temperature for four hours. The reaction solution was strained through cheesecloth and the filtrate added dropwise to stirred methanol. A milky emulsion appeared to be forming and concentrated hydrochloric acid was added to inhibit further emulsification. Polyglycidyl methacrylate was collected by filtration and dried at room temperature. The polymer was ground with a mortar and pestle yielding 59.7 g. of powdered product.

EXAMPLE 8

Glycidyl methacrylate (77.4 g.), tetrahydrofuran (515 ml.) and AIBN (0.39 g.) were added to a round bottom flask. The flask was flushed with nitrogen and heated at reflux temperature for about 24 hours to effect polymerization. After the reaction period was complete, the reaction solution was allowed to cool over a weekend and the polymer precipitated in methanol, recovered by filtration and dried. The lumpy product obtained was ground with a mortar and pestle to give 63.0 g. of a powder.

EXAMPLE 9

A mixture containing glycidyl methacrylate (77.4 g.), methyl ethyl ketone (515 ml.) and AIBN (0.40 g.) was stirred under a nitrogen blanket at 70°–72°C. for 23.8 hours. After the polymerization was complete, a trace of hydroquinone was added to the reaction solution and the solution was allowed to cool over a week end. Polyglycidyl methacrylate was precipitated from the reaction solution in methanol, yielding 57.2 g. of a white powder.

EXAMPLE 10

A mixture containing 6.8 g. of the polyglycidyl methacrylate produced in Example 6, p-azidobenzoic acid (8.0 g.), and benzyltriethylammonium chloride (0.4 g.) in dry methyl ethyl ketone (200 ml.) was stirred in a flask at reflux temperature for 4 hours. The reaction flask was covered with aluminum foil during the heating period. After 4 hours the reaction solution was cooled and strained through cheesecloth and the filtrate was added dropwise to 3 l. of methanol containing 2 ml. of concentrated hydrochloric acid. The azide polymer which precipitated was collected, washed with methanol and partially dried at room temperature. After this drying period, the partly caked polymer was broken into small pieces and ground with a mortar and pestle. This drying and grinding procedure was repeated until a fine yellow powder was obtained (9.7 g., 66%). The infrared spectrum of the powder product was consistent with poly(p-azidobenzoyloxyhydroxypropyl methacrylate). A sensitized solution of this polymer was applied to an aluminum base plate and the coated plate was exposed and developed. The product proved photosensitive and provided an image suitable for printing purposes.

EXAMPLE 11

A mixture containing 6.8 g. of the polyglycidyl methacrylate produced in Example 7, p-azidobenzoic acid (8.0 g.), benzyltriethylammonium chloride (0.4 g.) and dry methyl ethyl ketone (200 ml.) was refluxed for 4 hours. The flask containing the reaction mixture was covered with aluminum foil during the heating period. The reaction solution was cooled and strained through cheesecloth and the polymer precipitated and recovered in the manner described in Example 10. A dry fine yellow powder was obtained (8.9 g., 61%). The infrared spectrum of the powder was consistent with poly(p-azidobenzoyloxyhydroxypropyl methacrylate). A sensitized solution of this polymer was applied to an aluminum base plate and the coated plate exposed and developed. The product proved photosensitive and provided an image suitable for printing purposes.

EXAMPLE 12

A mixture containing 6.8 g. polyglycidyl methacrylate produced in Example 7, p-azidobenzoic acid (8.0 g.), 0.8 g. benzyltriethylammonium methoxide (40% "active" catalyst in methanol), and dry methyl ethyl ketone (200 ml.) was stirred at reflux temperature for approximately 16 hours. The reaction mixture was allowed to cool, strained through cheesecloth and the filtrate added dropwise to 3 l. of stirred methanol containing 2 ml. of concentrated hydrochloric acid. The polymer was collected as described in Example 10 and dried with intermittent grinding by mortar and pestle. 8.1 g. (55%) of a dry yellow powder was obtained. The infrared spectrum of the product was consistent with poly(p-azidobenzoyloxyhydroxypropyl methacrylate). A sensitized solution of this polymer was applied to an aluminum base plate and the coated plate was exposed and developed. The product proved photosensitive and provided an image suitable for printing purposes.

EXAMPLE 13

A mixture containing 6.8 g. of the polyglycidyl methacrylate produced in Example 8, p-azidobenzoic acid (8.0 g.), benzyltriethylammonium chloride (0.4 g.) and dry methyl ethyl ketone (200 ml.) was stirred at reflux temperature for 4 hours. The flask containing the reaction mixture was covered with aluminum foil during heating. Polymer was precipitated and dried in the manner described in Example 10, yielding 9.1 g. (62%) of a yellow powder. The infrared spectrum of this product was consistent with poly(p-azidobenzoyloxyhydroxypropyl methacrylate). A sensitized solution of this polymer was applied to an aluminum base plate and the coated plate was exposed and developed. The product proved photosensitive and provided an image suitable for printing purposes.

EXAMPLE 14

A solution containing glycidyl acrylate (30.0 g.), methyl ethyl ketone (200 ml.) and AIBN (0.15 g.) was stirred at 68.5 to 71°C. for 24 hours under a blanket of nitrogen. The polymerization solution was allowed to cool and strained through cheesecloth. The reaction flask was washed with a small portion of fresh methyl ethyl ketone, and the methyl ethyl ketone wash solution was also strained through cheesecloth and added to the filtrate, yielding a total filtrate volume of 238 ml.

A 59 ml. aliquot of the filtrate (theoretically estimated to contain 7.5 g. of polymer) was mixed with methyl ethyl ketone (161 ml.), p-azidobenzoic acid (9.8 g.), and benzyltriethylammonium chloride (0.44 g.) in a reaction flask. The flask was covered with aluminum foil and the mixture stirred at reflux temperature for 19 hours. The esterified polymer was precipitated in 2 l. of methanol containing 0.1% by weight of concentrated hydrochloric acid. The gummy polymer obtained was redissolved in the methyl ethyl ketone and the methyl ethyl ketone solution added dropwise to stirred water. The polymer which again precipitated was washed well with water, collected by filtration, washed with additional water and dried at room temperature in the dark. The infrared spectrum of the dried product was consistent with poly(p-azidobenzoyloxyhydroxypropyl acrylate). A sensitized solution of this polymer was applied to an aluminum base plate and the coated plate was exposed and developed. The product proved photosensitive and provided an image suitable for printing purposes.

EXAMPLE 15

To a round bottom flask were charged 8.0 g. of the crude m-azidobenzoic acid prepared in Example 2, polyglycidyl methacrylate (6.8 g., Example 6), benzyltriethylammonium chloride (0.4 g.) and methyl ethyl ketone (200 ml.). The resulting mixture was stirred at reflux temperature for 2.25 hours, after which it was allowed to stand overnight at room temperature. The reaction solution was then strained through cheesecloth and the filtrate added dropwise to 2 l. of stirred methanol containing 0.1% by weight concentrated hydrochloric acid. The precipitated polymer was collected by filtration and dried at room temperature in the dark. About 8.8 g. of a tan photosensitive polymer were obtained. The infrared spectrum of this product was consistent with poly(m-azidobenzoyloxyhydroxypropyl methacrylate). A sensitized solution of this polymer was applied to an aluminum base plate and the coated plate was exposed and developed. The product proved photosensitive and provided an image suitable for printing purposes.

EXAMPLE 16

Polyglycidyl methacrylate (6.8 g., Example 6), 8.0 g. of the crude o-azidobenzoic acid produced in Example 3, 0.8 g. benzyltrimethylammonium methoxide in methanol (40% catalyst), and methyl ethyl ketone (200 ml.) were charged to a round bottom flask covered with aluminum foil. The resulting mixture was stirred at reflux temperature for 2.1 hours. The reaction mixture was allowed to cool, filtered, and the brown filtrate obtained was added dropwise to 2 l. of stirred methanol containing 0.1% by weight concentrated hydrochloric acid. The polymer which precipitated was collected by filtration and dried at room temperature. During the drying period, the precipitate was intermittently ground with a mortar and pestle and, after drying was complete, 8.1 g. of a tan powder was obtained. The infrared spectrum of this powder was consistent with poly(o-azidobenzoyloxyhydroxypropyl methacrylate). A sensitized solution of this polymer was applied to an aluminum base plate and the coated plate was exposed and developed. The product proved photosensitive and provided an image suitable for printing purposes.

EXAMPLE 17

7.8 g. of the crude rust-colored 3-azido-2-naphthoic acid produced in Example 4, polyglycidyl methacrylate (5.0 g., Example 6), methyl ethyl ketone (148 ml.) and a 40% solution of benzyltrimethylammonium methoxide in methanol (0.6 g. of catalyst) were charged to a round bottom flask which was covered with aluminum foil. The resulting mixture was stirred at reflux temperature for 2.1 hours, allowed to cool, and filtered. The filtrate was added dropwise to 2 l. of stirred methanol containing 0.2% by weight concentrated hydrochloric acid. The polymer which precipitated was collected by filtration, and the filter cake was washed with methanol and dried at room temperature. 5.3 g. of a brownish-pink powder was obtained. The infrared spectrum of this product was consistent with poly(3-azido-2-naphthoyloxyhydroxypropyl methacrylate). A sensitized solution of this polymer was applied to an aluminum base plate and the coated plate was exposed and developed. The product proved photosensitive and provided an image suitable for printing purposes.

EXAMPLE 18

A mixture was prepared containing 3.0 g. of the polyglycidyl methacrylate produced in Example 6, p-azidobenzoyl chloride (5.7 g., Example 9), and dry methyl ethyl ketone (40 ml.). While the flask containing the mixture was shielded from light with aluminum foil, the mixture was stirred at reflux temperature for 6.5 hours. After completion of the reaction period, the reaction mixture was strained through cheesecloth and the filtrate added dropwise to stirred methanol. The precipitated polymer was collected, dried and ground in the manner described in Example 6. The infrared spectrum of this product was consistent with poly(p-azidobenzoyloxychloropropyl methacrylate). A sensitized solution of this polymer was applied to an aluminum base plate and the coated plate was exposed and developed. The product proved photosensitive and provided an image suitable for printing purposes.

EXAMPLE 19

To a round bottom flask were charged a copolymer of ethylene glycol methacrylate cinnamate and glycidyl methacrylate (5.0 g.), p-azidobenzoic acid (3.05 g.), benzyltriethylammonium chloride (0.15 g.), and dry methyl ethyl ketone (100 ml.). After charging was complete, the flask was covered with aluminum foil and the mixture contained therein heated at reflux temperature for 17.8 hours. The reaction solution was then cooled and strained through cheesecloth and the filtrate added dropwise to stirred methanol. The polymer which precipitated was washed thoroughly with methanol and collected by filtration. The filtrate was washed with additional quantities of methanol and dried at room temperature, yielding 5.7 g. of a light-yellow powder. An infrared spectrum of the polymeric powder obtained exhibited the anticipated band at 2110 $cm.^{-1}$ (indicating azide function). A sensitized solution of this polymer was applied to an aluminum base plate and the coated plate was exposed and developed. The product proved photosensitive and provided an image suitable for printing purposes.

EXAMPLE 20

A mixture containing glycidyl methacrylate (13.6 g.), p-azidobenzoic acid (15.8 g.), p-methoxyphenol (0.3 g.), benzyltriethylammonium chloride (0.54 g.) and tetrahydrofuran (40 ml.) was stirred at 69.5°C. for 3 hours. The reaction mixture was then allowed to cool and tetrahydrofuran was removed on a rotary evaporator at less than or equal to 43°C. The residue product was stirred with methylene chloride and the resulting mixture was allowed to stand at room temperature overnight. After standing overnight, the methylene chloride mixture was filtered to remove unreacted p-azidobenzoic acid (2.3 g.). The filtrate was washed sequentially with three 200 ml. portions of 5% sodium hydroxide, two 200 ml. portions of 5% hydrochloric acid and with water for neutrality. The washed organic phase was dried over anhydrous sodium sulfate, filtered, and the solvent removed on a rotary evaporator at less than or equal to 49°C., yielding 14.5 g. of an orange oil constituted by p-azidobenzoyloxyhydroxypropyl methacrylate.

EXAMPLE 21

A 13.0 g. of aliquot of the monomer prepared in Example 20 was stirred and dissolved in methyl ethyl ketone (87 ml.). AIBN (0.13 g.) was added to the solution in a reaction flask, the flask was covered with aluminum foil and the monomer was polymerized at 69°–69.5°C. for 4 hours under a blanket of nitrogen. The polymerization solution was allowed to cool, and after cooling was filtered. The filtrate was added dropwise to 1 l. of stirred methanol containing 1 ml. of concentrated hydrochloric acid. The polymer which precipitated was collected by filtration, washed with fresh methanol and dried at room temperature in the dark, yielding 6.65 g. of a light-yellow powder. The infrared spectrum of this product was consistent with poly(p-azidobenzoyloxyhydroxypropyl methacrylate). A sensitized solution of this polymer was applied to an aluminum base plate and the coated plate was exposed and developed. The product proved photosensitive and provided an image suitable for printing purposes.

EXAMPLE 22

A solution was prepared containing 2% by weight of the polymer produced in Example 12 in a 50—50 mixture of methyl ethyl ketone and ethylene glycol monoethyl ether acetate, and to the solution thus prepared was added 0.2% by weight Michler's ketone. The resulting solution was whirl coated onto an aluminum base plate which had been brush-grained, electrochemically etched, anodized and provided with a silicate barrier layer. The photosensitive coating thus provided was dried, exposed and developed with a developing solution containing 70% by weight 14°Be gum arabic, and 30% by weight ethylene glycol monoethyl ether acetate. Mounted on a 0.005 inch overpacked press, this plate provided 5000 good impressions, equivalent to 25,000 good impressions at normal spacings. Similar results were obtained using a base plate which was mechanically grained, sulfuric acid anodized, and silicated, but not electrochemically etched.

EXAMPLE 23

A solution was prepared containing 2% by weight of the photopolymer of Example 21 in a 1:2 volume ratio mixture of methyl ethyl ketone and ethylene glycol monoethyl ether acetate. 0.2% by weight Michler's ketone was added and the solution whirl coated onto a brush-grained, electrochemically etched, anodized, and silicated aluminum plate. After drying and exposure, the coated plate was developed with a solution containing 70% by weight 14°Be gum arabic and 30% by weight ethylene glycol monoethyl ether acetate. Mounted on a 0.005 inch overpacked press, 6000 good impressions, equivalent to 30,000 impressions at normal spacing, were obtained with some wear of the plate.

In view of the above, it will be seen that the several objects of the invention are achieved and other advantageous results attained.

As various changes could be made in the above methods and products without departing from the scope of the invention, it is intended that all matter contained in the above description shall be interpreted as illustrative and not in a limiting sense.

What is claimed is:

1. A lithographic plate which comprises a base plate having a coating on the surface thereof comprising a light-sensitive polymer susceptible to crosslinking upon exposure to actinic light containing the recurring unit:

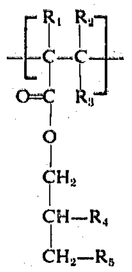

wherein $R_1$, $R_2$, and $R_3$ are each selected from the group consisting of hydrogen, halogen and lower alkyl, and at least one of $R_4$ and $R_5$ is selected from the group consisting of azidobenzoyloxy and azidonaphthoyloxy, the other of $R_4$ and $R_5$ being selected from the group consisting of hydroxyl, halogen, alkoxy, aryloxy, aralkoxy, alkoxyalkoxy, aryloxyalkoxy, alkoxyaryloxy, aryloxyaryloxy, alkylacyloxy, arylacyloxy, alkenylacyloxy, aralkenylacyloxy, heterocyclic substituted alkenylacyloxy, azidobenzoyloxy and azidonaphthoyloxy.

2. A lithographic plate as set forth in claim 1 wherein said base plate is constituted by a thin sheet of aluminum.

3. A lithographic plate as set forth in claim 2 wherein said base plate is grained and anodized.

4. A lithographic plate as set forth in claim 3 wherein said base plate is electrochemically grained.

5. A process for preparing presensitized lithographic plates which comprises the steps of:

preparing a mixture comprising a volatile solvent and a light-sensitive polymer susceptible to crosslinking upon exposure to actinic light containing the recurring unit:

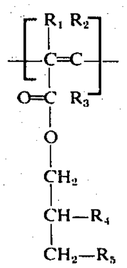

wherein $R_1$, $R_2$ and $R_3$ are each selected from the group consisting of hydrogen, halogen and lower alkyl, and at least one of $R_4$ and $R_5$ is selected from the group consisting of azidobenzoyloxy and azidonaphthoyloxy, the other of $R_4$ and $R_5$ being selected from the group consisting of hydrogen, halogen, alkoxy, aryloxy, aralkoxy, akloxyalkoxy, aryloxyalkoxy, alkoxyaryloxy, aryloxyaryloxy, alklacyloxy, arylacyloxy, alkenylacyloxy, aralkenylacyloxy, heterocyclic substituted acyloxy, azidobenzoyloxy and azidonaphthoyloxy;

applying said mixture to the surface of a base plate; and evaporating said solvent from the surface of the base plate.

6. A process as set forth in claim 5 wherein said solvent is aqueous and said mixture is an emulsion.

7. A process as set forth in claim 5 wherein a sensitizer is also included in said solution.

8. A process as set forth in claim 5 wherein an exposed plate suitable for printing is prepared by the additional steps of:

exposing the presensitized plate through a photographic negative to a source of actinic light for a time sufficient to photocrosslink said light-sensitive polymer in the areas exposed; and removing noncrosslinked polymer from the unexposed areas of the plate with a solvent for the noncrosslinked polymer.

* * * * *